(12) United States Patent
Katayama et al.

(10) Patent No.: US 12,421,842 B2
(45) Date of Patent: Sep. 23, 2025

(54) INTERFERENCE COMPENSATED AXIAL MAGNETOMETER MEASUREMENTS

(71) Applicant: Schlumberger Technology Corporation, Sugar Land, TX (US)

(72) Inventors: Makito Katayama, Cheltenham (GB); Edward Richards, Cheltenham (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 18/657,902

(22) Filed: May 8, 2024

(65) Prior Publication Data

US 2024/0376815 A1  Nov. 14, 2024

Related U.S. Application Data

(60) Provisional application No. 63/500,674, filed on May 8, 2023.

(51) Int. Cl.
| | |
|---|---|
| *E21B 47/0228* | (2012.01) |
| *E21B 7/06* | (2006.01) |
| *E21B 44/00* | (2006.01) |
| *E21B 47/18* | (2012.01) |
| *G01R 33/00* | (2006.01) |

(52) U.S. Cl.
CPC ............ *E21B 47/0228* (2020.05); *E21B 7/06* (2013.01); *E21B 44/005* (2013.01); *E21B 47/18* (2013.01); *G01R 33/0017* (2013.01)

(58) Field of Classification Search
CPC ...... E21B 47/0228; E21B 7/06; E21B 44/005; E21B 47/18; E21B 44/00; G01R 33/0017; G01V 3/26; G01V 11/002
USPC .......................... 324/356, 355, 354, 351, 323
See application file for complete search history.

(56) References Cited

U.S. PATENT DOCUMENTS

| | | | |
|---|---|---|---|
| 9,822,633 B2* | 11/2017 | Sugiura ................. | E21B 44/005 |
| 11,802,476 B2* | 10/2023 | Herrera .............. | G01R 33/0094 |
| 2013/0069655 A1 | 3/2013 | McElhinney | |
| 2013/0314092 A1 | 11/2013 | Shumway | |
| 2016/0258277 A1* | 9/2016 | Bittar ........................ | E21B 7/06 |
| 2016/0333682 A1* | 11/2016 | Griffing .................... | E21B 7/04 |
| 2017/0138173 A1* | 5/2017 | Estes ........................ | E21B 7/04 |
| 2020/0270981 A1 | 8/2020 | Rodney | |
| 2020/0400856 A1 | 12/2020 | Castleman | |
| 2022/0251938 A1 | 8/2022 | Whitmore | |
| 2023/0113706 A1 | 4/2023 | Rohrkemper | |
| 2024/0337182 A1 | 10/2024 | Katayama et al. | |
| 2024/0410270 A1* | 12/2024 | Schiemeier ........... | E21B 47/092 |

\* cited by examiner

*Primary Examiner* — Giovanni Astacio-Oquendo
(74) *Attorney, Agent, or Firm* — Jeffrey D. Frantz (57) ABSTRACT

A method for making axial magnetic field measurements in a downhole tool includes evaluating axial magnetic field measurements to determine a magnetic interference offset and removing the magnetic interference offset to obtain compensated axial magnetic field measurements.

6 Claims, 5 Drawing Sheets

INTERFERENCE COMPENSATED AXIAL MAGNETOMETER MEASUREMENTS

CROSS-REFERENCE TO RELATED APPLICATION(S)

The present disclosure claims priority from U.S. Prov. Appl. No. 63/500,674, filed on May 8, 2023, entitled "Interference compensated magnetometer measurements", herein incorporated by reference in its entirety.

BACKGROUND

In conventional drilling and measurement while drilling (MWD) operations, wellbore inclination and wellbore azimuth are determined at a discrete number of longitudinal points along the axis of the wellbore. These discrete measurements may be assembled into a survey of the well and used to calculate a three-dimensional well path (e.g., using the minimum curvature or other curvature assumptions). Wellbore inclination is commonly derived (computed) from tri-axial accelerometer measurements of the earth's gravitational field. Wellbore azimuth (also commonly referred to as magnetic azimuth) is commonly derived from a combination of tri-axial accelerometer and tri-axial magnetometer measurements of the earth's gravitational and magnetic fields.

Rotary steerable tools (such as the SLB PowerDrive RSS tools) commonly include triaxial accelerometers and triaxial magnetometers for making both static and continuous wellbore inclination and wellbore azimuth measurements near the bit (e.g., while drilling). Automated drilling routines commonly make use of these measurements to steer the direction of drilling along a desired path. One difficulty with the use of automated steering routines is the susceptibility of the magnetometers to the many sources of magnetic interference in and around the RSS tool. For example, solenoid actuated valves commonly used in mud pulse or mud siren telemetry pulsers can interfere with the magnetometer measurements and cause significant errors in wellbore azimuth measurements. Likewise, the deployment of electromagnetic (EM) transmitters near the drill bit (e.g., for deep reading and look ahead resistivity measurements) can also interfere with the magnetometer measurements. An added difficulty is that these interference sources are commonly intermittent. There is a need in the industry for improved methods for making downhole magnetometer measurements that compensate for the aforementioned intermittent magnetic interference.

SUMMARY

Methods for making compensated magnetic field measurements in a subterranean wellbore are disclosed. A first method includes making axial magnetic field measurements in a downhole tool while the tool is deployed in the wellbore. A first average of the magnetic field measurements is computed over a first time interval in which there is no EM interference and a second average of the magnetic field measurements is computed over a second time interval in which there is EM interference. An interference offset is taken as a difference between the first average and the second average and is removed from the magnetic field measurements made at a subsequent time during which there is EM interference to compute compensated magnetic field measurements.

A second method includes making axial magnetic field measurements in a downhole tool while the tool is deployed in the wellbore. An intermittent source of electromagnetic interference is monitored and a compensated magnetic field measurement is set equal to the magnetic field measurement when the intermittent source is inactive. A difference between the magnetic field measurement and a previous compensated magnetic field measurement is computed when the source of the electromagnetic interference is active. The difference is compared with a predetermined threshold and a compensated magnetic field measurement is set equal to the magnetic field measurement when the difference is less than the threshold. A compensated magnetic field measurement is set equal to the previous compensated magnetic field measurement when the difference is greater than the threshold.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

For a more complete understanding of the disclosed subject matter, and advantages thereof, reference is now made to the following descriptions taken in conjunction with the accompanying drawings, in which.

DETAILED DESCRIPTION

Methods for making compensated magnetic field measurements using a downhole tool deployed in a subterranean wellbore are disclosed. Example embodiments disclosed herein may provide various technical advantages and improvements over the prior art. For example, the disclosed embodiments may advantageously compensate for intermittent electromagnetic interference in a rotary steerable tool (e.g., resulting from a solenoid actuated valve in a mud pulser or a near bit EM transmitter). The compensated measurements may advantageously enable wellbore azimuth measurements to be made that have improved accuracy for use in automated steering routines.

Figure 1:
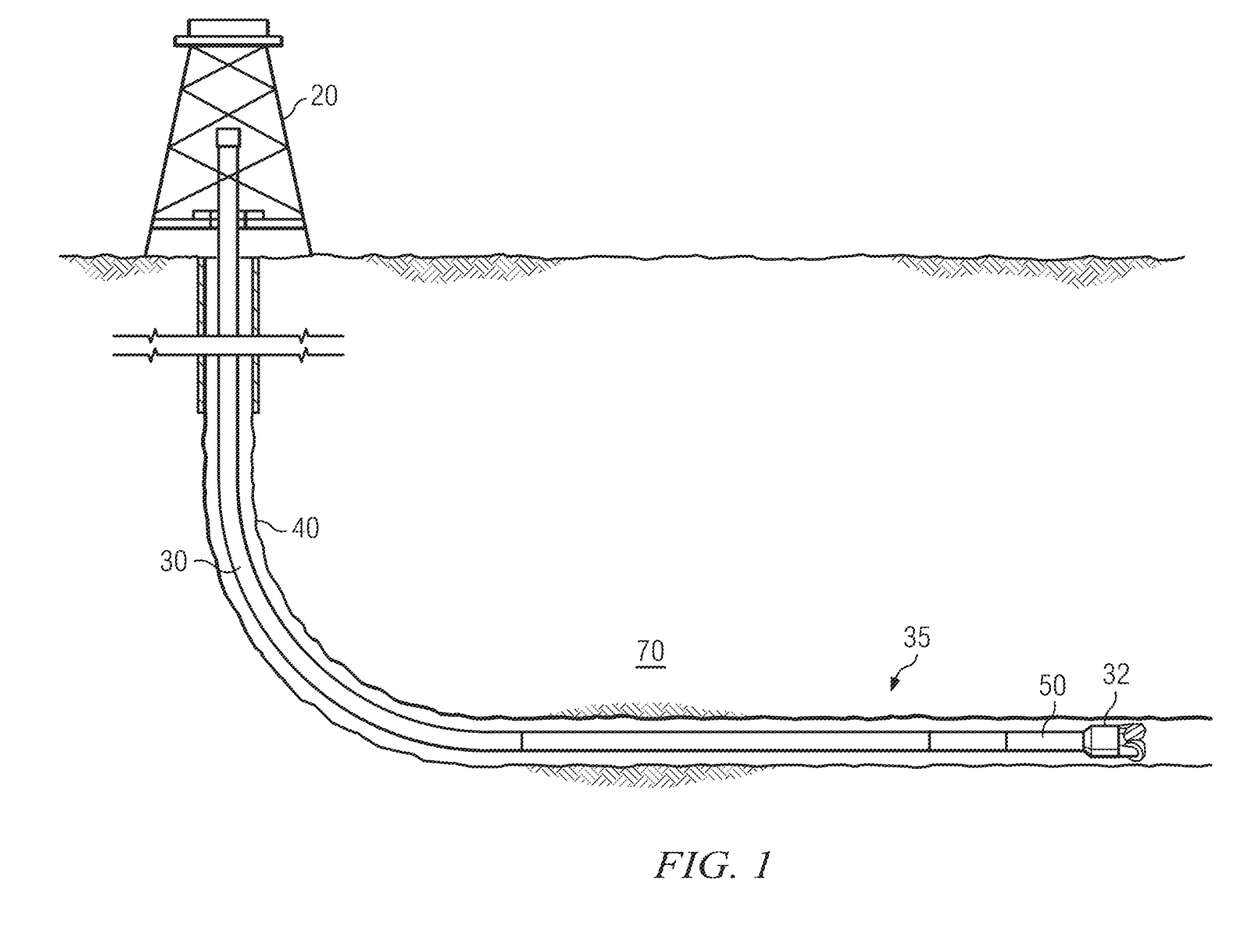
FIG. 1 depicts a drilling rig including an example downhole tool configured to make compensated magnetic field measurements.

FIG. 1 depicts an example drilling rig 20 positioned over a subterranean formation 70. The drilling rig may include a derrick and a hoisting apparatus (not shown) for raising and lowering a drill string 30, which, as shown, extends into wellbore 40 and includes a drill bit 32 deployed at the lower end of a bottom hole assembly (BHA) 35. In the depicted embodiment, the drill string 30 further includes a rotary steerable (RSS) tool 50 deployed above the bit.

It will be understood that the deployment illustrated on FIG. 1 is merely an example. Drill string 30 may include substantially any suitable downhole tool components, for example, including a steering tool such as a rotary steerable tool, a downhole telemetry system, and one or more additional MWD and/or LWD tools including various sensors for sensing downhole characteristics of the borehole and the surrounding formation. The disclosed embodiments are by no means limited to any particular drill string configuration. It will be further understood that the disclosed embodiments are not limited to use with a land rig 20 as illustrated on FIG. 1, but may be equally well suited for use with either onshore or offshore operations.

Figure 2:
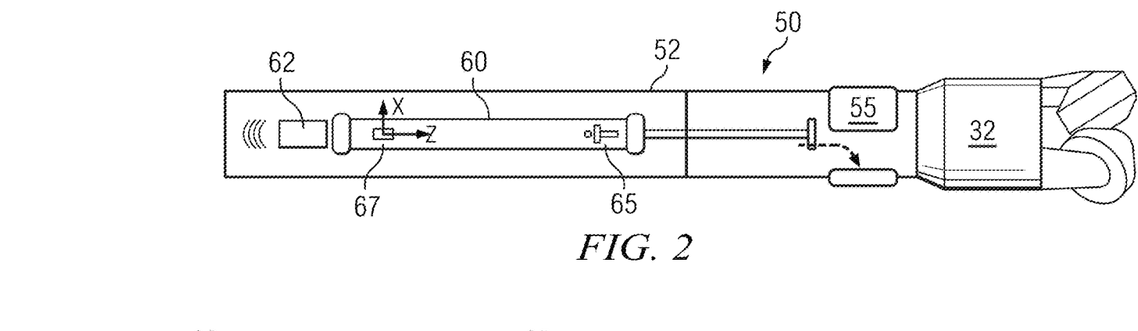
FIG. 2 depicts an example rotary steerable tool including triaxial magnetometers, triaxial accelerometers, and a magnetic signal emitter.

FIG. 2 depicts a schematic of an example RSS tool 50 and drill bit 32. In the depicted embodiment, the RSS tool 50 includes a plurality of steering actuators (e.g., blades) 55 that are deployed on a tool collar (or body) 52. In the depicted embodiment, the blades 55 are configured to engage the wellbore wall and thereby steer the direction of drilling (e.g., by pushing the bit 32 in a desired lateral direction). It will be appreciated that other steering actuation mechanisms are known to those of ordinary skill in the art and that the disclosed embodiments are expressly not limited to the use of blades or even to the use of external steering actuators.

The RSS tool 50 further includes a control unit 60 including accelerometer 65 and magnetometer 67 sensor sets (e.g., triaxial accelerometer and triaxial magnetometer sets). These navigation sensors may include substantially any suitable available devices. Suitable accelerometers for use in sensor set 65 may include, for example, conventional Q-flex types accelerometers or micro-electro-mechanical systems (MEMS) solid-state accelerometers. Suitable magnetic field sensors for use in sensor set 67 may include, for example, conventional ring core flux gate magnetometers or magnetoresistive sensors. Although not depicted, the controller may further optionally include gyroscopic sensors, such as a rate gyro or a MEMS type gyro, and a rotation rate sensor, such as a Hall Effect sensor, configured to measure a rotation rate of the control unit with respect to the tool body.

With continued reference to FIG. 2, the control unit may further include an electronic controller (not depicted in the figure). A suitable controller may include, for example, one or more programmable processors, such as a digital signal processor or other microprocessors or microcontrollers that may be connected with electronic memory (solid-state memory). The controller may be configured to execute computer-readable program code embodying logic and therefore be utilized to execute the method embodiments described in more detail below (e.g., in FIGS. 4, 6, 9, and 10 as well as in Eqs. 1-9).

The example RSS tool 50 depicted further includes a source 62 of magnetic interference (also referred to herein as a source of EM interference) deployed in proximity to (i.e., in sensory range of) the magnetometer set 67. For example, RSS tool 50 may include a mud-pulse or mud-siren telemetry system including at least one solenoid actuated pulser (valve). In another embodiment, the RSS tool 50 may include an electromagnetic transmitter configured for making electromagnetic LWD measurements (such as deep reading EM measurements).

It will be appreciated that the disclosed embodiments may be utilized with substantially any RSS tools in which a magnetic interference source is in sensory range of a magnetometer set. It will further be appreciated that in such tools the magnetometer set may be deployed such that it rotates with the drill string (referred to in the industry as a strap-down configuration) or may be deployed in a substantially non-rotating or slowly rotating sensor housing (referred to in the industry as a roll-stabilized configuration). The disclosed embodiments are expressly not limited in this regard and may be utilized in either strap-down or roll-stabilized RSS tools.

While FIG. 2 depicts a rotary steerable tool 50, it will be understood that the disclosed embodiments are not so limited. For example, with reference again to FIG. 1, drill string 30 may include a measurement while drilling (MWD) tool including a corresponding magnetometer set. As is known to those of ordinary skill in the art, MWD tools commonly include a mud pulse telemetry transmitter or other telemetry system and an alternator for generating electrical power. These may act as an intermittent source of magnetic interference (as described above with respect to source 62 in RSS tool 50 in FIG. 2). It will thus be appreciated that the disclosed embodiments are not limited to use with a rotary steerable tool and may also be used in an MWD tool or other downhole tool configured to make magnetic field measurements.

Figure 3:
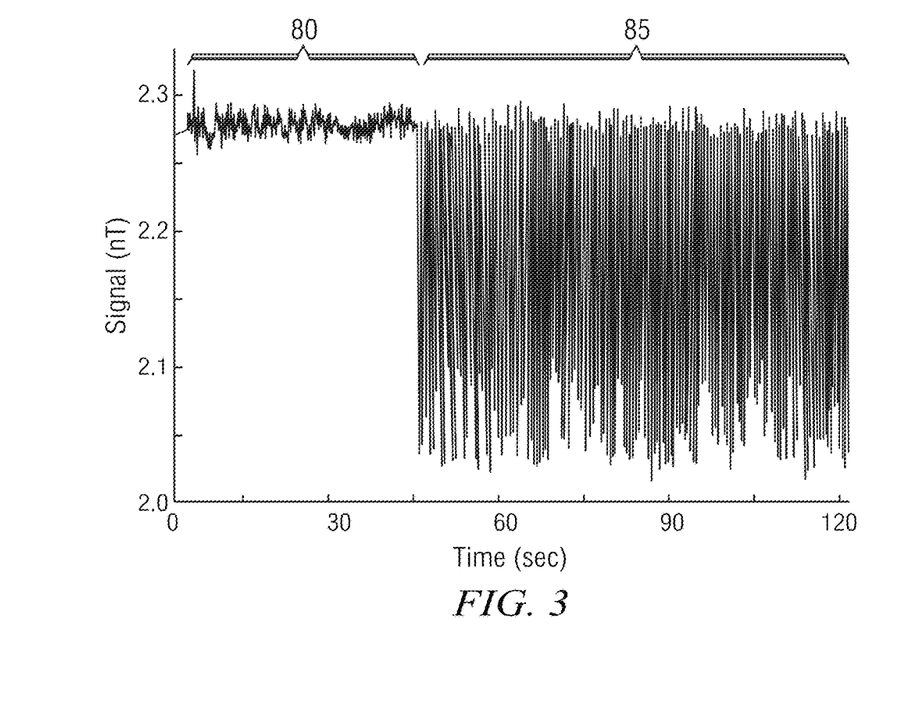
FIG. 3 depicts a plot of axial magnetometer measurements versus time for a first block of time without EM emission and a second block of time with intermittent EM emission.

Turning now to FIG. 3, a plot of example axial (z-axis) magnetometer measurements versus time is depicted for a first block of time 80 without EM emission and a second block of time 85 with intermittent EM emission. In this particular example, the EM interference was generated by a solenoid valve in a mud pulser. In the absence of the EM interference (block 80), the axial magnetometer measurements are nominally constant (with low-level measurement noise) as depicted. As known to those of ordinary skill in the art, in the absence of interference the magnetic field measurements may be averaged (e.g., using a moving average) and then used (along with corresponding accelerometer measurements) to compute the wellbore azimuth. The solenoid EM emissions can be seen to cause significant deviation in the axial magnetometer measurements (in block 85). As depicted, the effect of the interference is significantly greater than the low-level measurement noise in block 80 (over an order of magnitude in this particular example). This interference can (and does) cause significant errors in the computed wellbore azimuth (e.g., up to and exceeding 20 degrees error in some applications) and is particularly problematic in operations that employ automated steering routines, such as auto turn routines.

Figure 4:
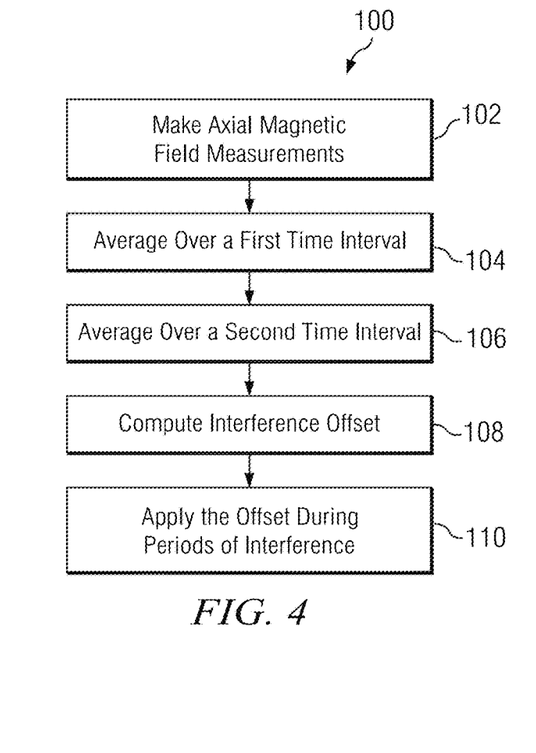
FIG. 4 depicts a flow chart of one example method for magnetic interference compensation.

FIG. 4 depicts a flow chart of one example method 100 for making compensated magnetic field measurements. Method 100 may be particularly well-suited making axial magnetic field measurements (axial magnetic interference compensation). By axial it is meant magnetic field measurements that are parallel with the tool axis (referred to herein as the z-axis). The magnetometer measurements may be made, for example, while circulating drilling fluid in the wellbore at 102 (e.g., while drilling). The axial magnetic field measurements ($B_z$) are averaged over a first time interval $t_1$ at 104 at which there is no EM interference (e.g., the solenoid or EM transmitter is inactive or off). The axial magnetic field measurements are averaged over a second time interval $t_2$ at 106 during which there is EM interference (e.g., the solenoid or EM transmitter is active or intermittently on). It will be appreciated that the first and second time intervals $t_1$ and $t_2$ may be the same or different lengths of time. An EM interference offset is computed at 108, for example, as the difference between the averaged magnetic fields obtained at 104 and 106. The computed offset may then be applied to (or removed from) the axial magnetic field measurements made during periods of interference 110 (e.g., added to or subtracted from the magnetic field measurements made during periods of interference). It will be appreciated that this process of averaging and computing an interference offset may be repeated from time to time during a drilling operation to update the EM interference offset (e.g., at 10, 30, or 60 minute intervals during a drilling operation). While not depicted on FIG. 4, method 100 may further optionally include using the compensated magnetic field measurements to compute a wellbore azimuth and changing the direction of drilling in response to the computed wellbore azimuth.

Figure 5:
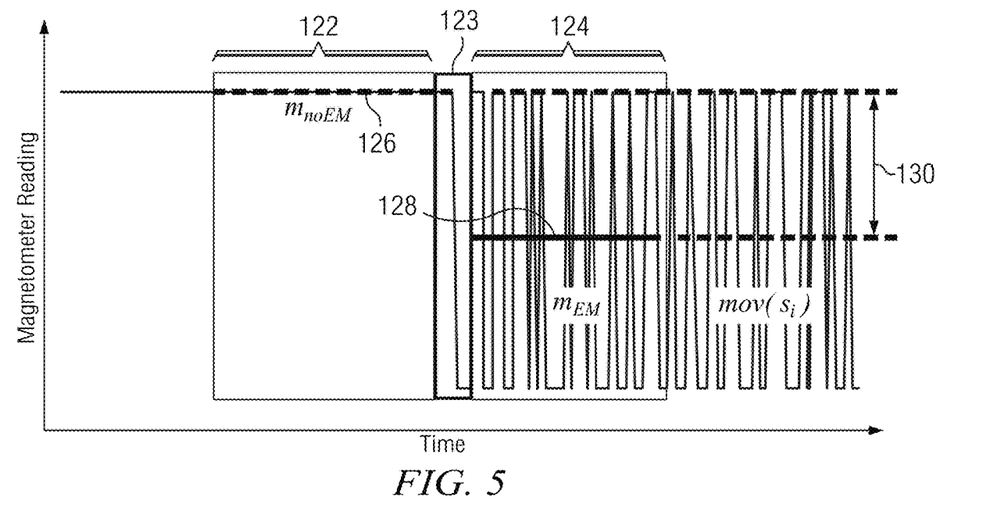
FIG. 5 depicts a schematic plot of axial magnetometer measurements versus time and further illustrates the method shown on FIG. 4.

FIG. 5 depicts a schematic plot of axial magnetometer measurements versus time and is similar to FIG. 3 in that it shows measurements that are essentially constant during a first block of time in which there is no EM emission and exhibiting significant scatter during a second block of time with intermittent EM emissions. FIG. 5 is intended to further illustrate method 100 shown on FIG. 4. The axial magnetic field measurements are averaged over the first and second (non-overlapping) time intervals $t_1$ and $t_2$ 122 and 124 as depicted. These averages are given as $m_{noEM}$ and $m_{EM}$ and are shown as dashed lines at 126 and 128. An EM interference offset, $b_s$, may then be computed as the difference between $m_{noEM}$ and $m_{EM}$ as depicted at 130. Although the disclosed embodiments are not limited in this regard, the depicted embodiment further includes a short transition buffer (time) 123 between time intervals $t_1$ and $t_2$ (by short it may be meant that the transition buffer advantageously has a duration that is less than the duration of either of the first and second time intervals).

With continued reference to FIGS. 4 and 5, the computed offset may be applied to the axial magnetic field measurements made during the EM interference, for example, as follows:

$$\hat{s}_i = mov(s_i + b_s, T) \quad (1)$$

$$b_s = m_{noEM} = m_{EM} \quad (2)$$

where $\hat{s}_i$ represents the compensated axial magnetic field measurement, $s_i$ represents the axial magnetic field measurements made during the period of EM interference (e.g., on the righthand side of FIG. 5), and $mov(s_i+b_s, T)$ represents a moving average of the offset measurements $s_i+b_s$ computed over the time or measurement interval T.

Figure 6:
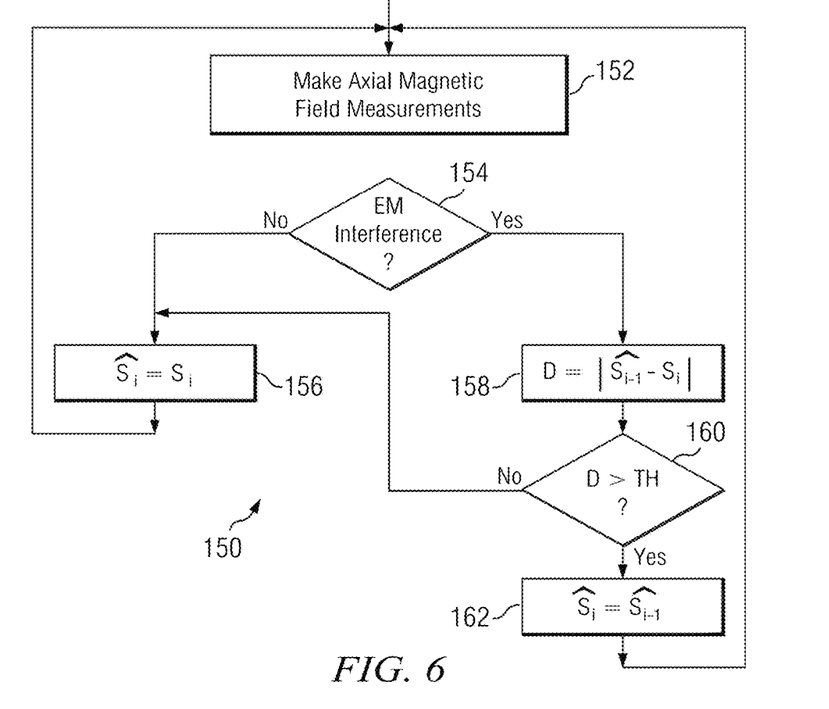
FIG. 6 depicts a flow chart of another example method for magnetic interference compensation.

Turning now to FIG. 6, a flow chart of another example method 150 for compensating downhole magnetic field measurements is depicted. Magnetometer measurements may be made, for example, while circulating drilling fluid in the wellbore at 152 (e.g., while drilling). The activity of the EM interference source is monitored at 154. The interference source may be active, for example, when the mud pulse or mud siren telemetry system is actively transmitting data to the surface or when an EM transmitter is transmitting electromagnetic energy while making resistivity measurements. Otherwise, the interference source may be taken to be inactive. It will be appreciated that in certain example embodiments, the RSS controller may be configured to receive tool status updates from the telemetry system or an EM transmitter. These updates may indicate, for example, an active status at which EM interference (or intermittent interference) is or may be present or an inactive status at which there is no EM interference.

With continued reference to FIG. 6, it will be understood that no interference compensation is required when the interference source is inactive (i.e., when there is no EM interference). Therefore, as indicated at 156, $\hat{s}_i=s_i$. In other words, the compensated axial magnetic field measurement $\hat{s}_i$ may be taken to be equal to the actual axial magnetic field measurement $s_i$. When EM interference is present, a differential measurement (a difference) may be computed at 158, for example, as follows: $D=|\widehat{s_{i-1}}-s_i|$, where D represents the difference, $\widehat{s_{i-1}}$ represents the previous (i−1) compensated measurement, and $|\cdot|$ represents the absolute value of the difference. The difference may then be compared with a predetermined threshold at 160. In example embodiments the threshold may be, for example, one, two, or three standard deviations ($\sigma$, $2\sigma$, or $3\sigma$). It will be appreciated that the threshold may be selected, for example, to exceed the magnitude of the measurement noise and may be further based on the measurement frequency and how rapidly magnetic field transitions between the maxima and the minima during the intermittent interference.

When the difference D (or absolute value thereof) is greater than the threshold, the compensated axial magnetic field measurement may be set equal to the previous compensated axial magnetic field measurement at 162, i.e., $\hat{s}_i = \widehat{s_{i-1}}$. When the difference D is less than the threshold, the compensated magnetic field measurement may be taken to be equal to the actual axial magnetic field measurement $s_i$ at 156. Moreover, in other example embodiments, a moving average of $\hat{s}_i$ may be computed at 156.

In an alternative embodiment, the difference D may be computed as a difference between a moving average of recent compensated measurements and the most recent magnetic field measurement. For example, $D=|mov(\widehat{s_n})-s_i|$, where $mov(\widehat{s_n})$ represents a moving average of the n most recent compensated measurements. Such an embodiment may be more robust to noise and to smaller incremental changes in the magnetic field measurements induced by the interference (e.g., in embodiments having a high measurement frequency).

Figure 7A:
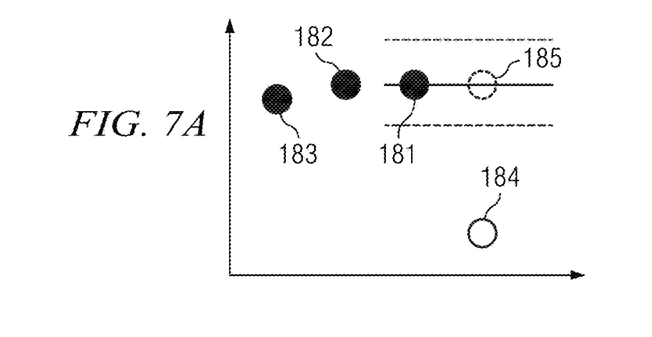
FIGS. 7A and 7B (collectively FIG. 7) depict schematic plots of axial magnetometer measurements versus time and further illustrates the method shown on FIG. 6.
Figure 7B:
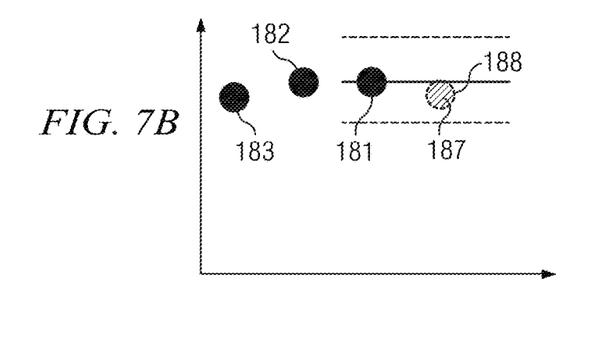

FIGS. 7A and 7B (collectively FIG. 7) depict schematic plots of axial magnetometer measurements versus time and further illustrate the method shown on FIG. 6. In FIGS. 7A and 7B, the three most recent compensated measurements ($\widehat{s_{i-1}}$, $\widehat{s_{i-2}}$, and $\widehat{s_{i-3}}$) are shown as solid filled circles at 181, 182, and 183. An example threshold is indicated by the horizontal dashed lines. In FIG. 7A, the new measurement $s_i$ (shown as an open circle at 184) is outside the threshold band such that D is greater than the threshold. Therefore, the compensated measurement $\hat{s}_i$ is set equal to the previous compensated measurement $\widehat{s_{i-1}}$ at 162 as indicated by the dashed circle at 185. In FIG. 7B, the new measurement $s_i$ (shown as a hatch filled circle at 187) falls within the threshold band (the dashed lines) such that D is less than the threshold. Therefore, the compensated measurement $\hat{s}_i$ is set equal to the new measurement $s_i$ at 156 as indicated by the dashed circle at 188).

Figure 8:
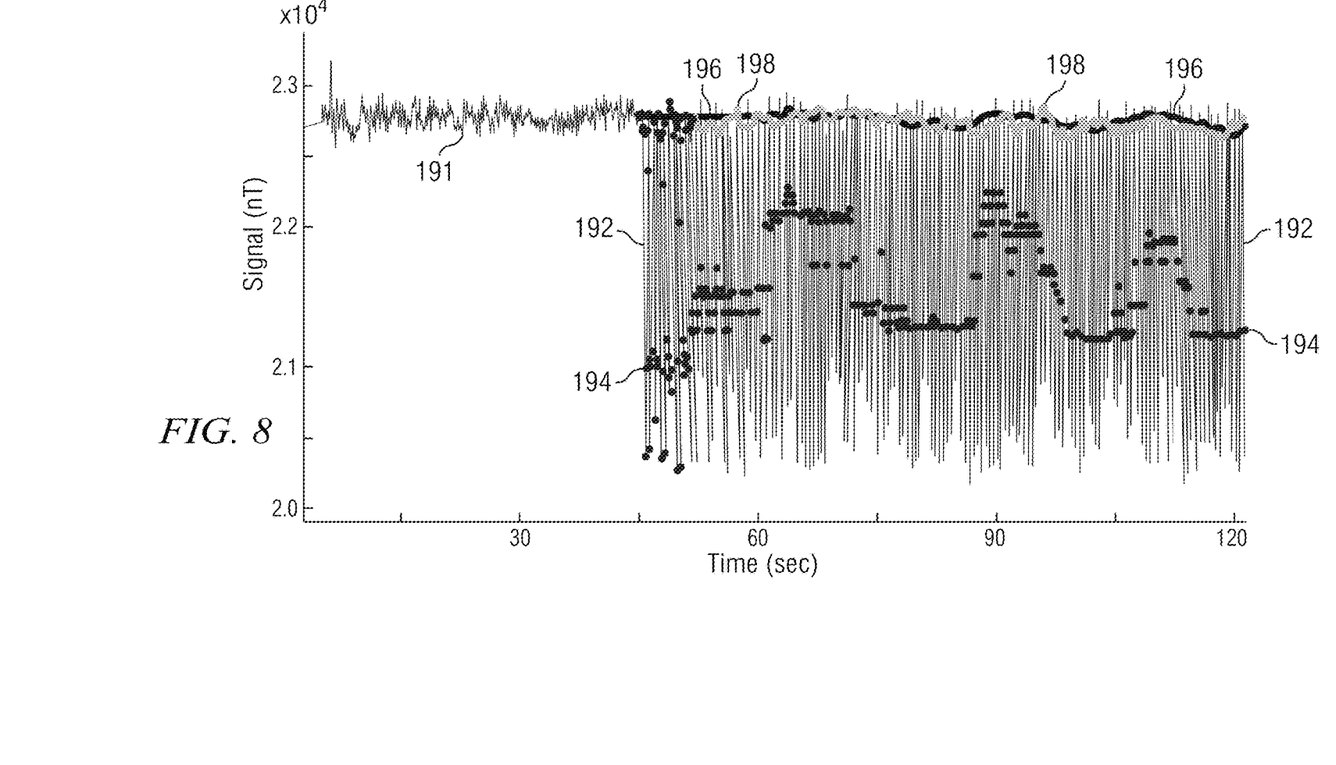
FIG. 8 depicts the plot of the axial magnetometer measurements shown on FIG. 3 and further shows the compensation provided by the methods depicted in FIGS. 4 and 6.

FIG. 8, depicts an example implementation of the methods shown on FIGS. 4 and 6 using the axial magnetometer data shown on FIG. 3. The raw data (the raw axial magnetometer measurements) are shown in black at 191 (with no interference) and at 192 (with interference). Averaged measurements obtained using a prior art median filter are shown as black circles (dots) at 194. The median filtered data was obtained by computing median values over some measurement interval (the measurement interval T in this example). Note that the median values were strongly influenced by the solenoid interference and do not provide an accurate compensation. The results from methods 100 and 150 are shown as a thick black line at 196 and a thick grey line at 198, respectively. Note that each of the disclosed methods provides an accurate compensation of the solenoid interference in this example. It will be appreciated that a median filter or moving average may be optionally further applied to the compensated measurements (after execution of method 100 or method 150). These filtered measurements may then be still further processed (e.g., in combination with accelerometer measurements) to compute the wellbore azimuth.

Figure 9:
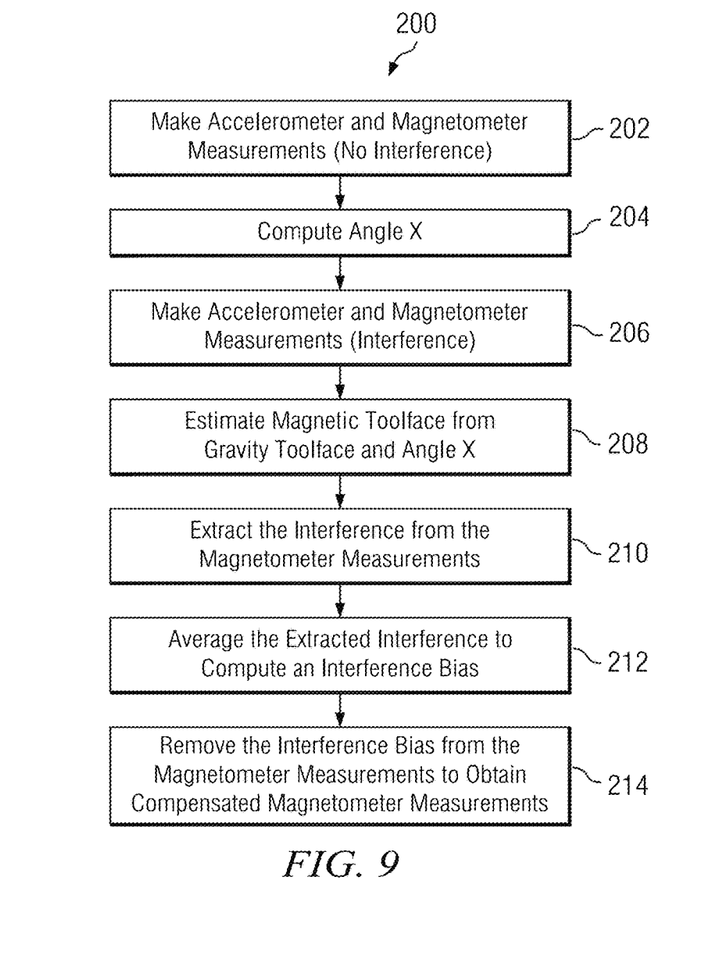
FIG. 9 depicts a flow chart of yet another example method for magnetic interference compensation.

Turning now to FIG. 9, a flow chart of yet another example method 200 for making compensated magnetic field measurements is depicted. Method 200 may be particularly well-suited for making compensated cross-axial magnetic field measurements (cross-axial magnetic interference compensation). By cross-axial it is meant magnetic field measurements that are perpendicular with the tool axis (referred to herein as the x- and y-axes). In method 100, the magnetic field measurements are compensated by averaging the measurements over time intervals in which there is no interference and in which magnetic interference is present. Method 100 is effective, in part, because the inclination and azimuth of the wellbore tend to be stable over short periods of time (i.e., over the averaging intervals) such that the axial magnetic field does not change appreciably. However, cross-axial magnetic field measurements may change more significantly since the toolface of the control unit (and therefore the sensors) is not necessarily constant over the averaging interval.

Method 200 may include for example making cross-axial accelerometer (gravitational field) measurements and cross-axial magnetometer (magnetic field) measurements at 202 during a time at which there is no magnetic interference (e.g., no solenoid or EM interference). These measurements may be evaluated at 204 to compute angle X (the angular difference between the gravity toolface and the magnetic toolface). Cross-axial accelerometer measurements and cross-axial magnetometer measurements may also be made at 206 when magnetic interference is present. The magnetic toolface of the measurements made in the presence of the interference may be estimated at 208 from the gravity toolface and the previously computed angle X. The magnetic interference (or interference signal) may be extracted from the magnetic field measurements at 210 using the magnetic toolface estimated at 208. An interference bias (such as a solenoid bias) may be computed at 212 by averaging the extracted interference signal over some predetermined number of measurements. The interference bias may then be removed from subsequent cross-axial magnetic field measurements at 214 to obtain the compensated cross-axial measurements (e.g., via removing the bias from the measurements).

With continued reference to FIG. 9, angle X may be computed at 204, for example, as follows:

$$X = \psi_g - \psi_m = \operatorname{atan}\left(\frac{G_x B_y - G_y B_x}{G_x B_x + G_y B_y}\right) \quad (3)$$

where X represents angle X, $\psi_g$ and $\psi_m$ represent the gravity toolface and magnetic toolface, $G_x$ and $G_y$ represent the cross-axial accelerometer measurements, and $B_x$ and $B_y$ represent the cross-axial magnetometer measurements. The cross-axial accelerometer measurements and cross-axial magnetometer measurements made in the presence of the magnetic interference at 206 may be given, for example, as follows:

$$\begin{pmatrix} G_x \\ G_y \end{pmatrix} = G_T \begin{pmatrix} \cos\psi_g \\ -\sin\psi_g \end{pmatrix} \quad (4)$$

$$\begin{pmatrix} B_x \\ B_y \end{pmatrix} = B_T \begin{pmatrix} \cos\psi_m \\ -\sin\psi_m \end{pmatrix} + s_i \begin{pmatrix} s_x \\ s_y \end{pmatrix} \quad (5)$$

where $G_T$ and $B_T$ represents the total cross-axial gravitational and magnetic fields, $s_i$ represents the operational state of the interference source (e.g., $s_i=0$ when the source is off and $s_i=1$ when the source is on), and $s_x$ and $s_y$ represent the cross-axial interference components. When there is no magnetic interference (when the solenoid or EM transmitter is off or not running such that $s_i=0$), $B_T$ and $\psi_m$ may be determined readily from the cross-axial magnetometer measurements $B_x$ and $B_y$. However, during a time of intermittent magnetic interference (when $s_i$ switches intermittently between values of 0 and 1), $B_T$ and $\psi_m$ cannot be determined directly from the cross-axial magnetometer measurements.

As noted above, angle X may be used to estimate the magnetic toolface $\psi_m$ from the gravity toolface $\psi_g$ such that the cross-axial magnetometer measurements made with the magnetic interference at 206 may be given as follows:

$$\begin{pmatrix} B_{xi} \\ B_{yi} \end{pmatrix} = B_T \begin{pmatrix} \cos(\psi_{Gi} - X) \\ -\sin(\psi_{Gi} - X) \end{pmatrix} + s_i \begin{pmatrix} s_x \\ s_y \end{pmatrix} \quad (6)$$

The interference signal (the magnetic interference) may then be extracted at 210, for example, by subtracting expected magnetic field measurements computed using the estimated magnetic tool face from the actual magnetic field measurements as follows:

$$s_i \begin{pmatrix} s_x \\ s_y \end{pmatrix} = \begin{pmatrix} B_{xi} \\ B_{yi} \end{pmatrix} - B_T \begin{pmatrix} \cos(\psi_{Gi} - X) \\ -\sin(\psi_{Gi} - X) \end{pmatrix} \quad (7)$$

It will be appreciated, that in the case of the cross-axial magnetometers, applying any type of filter may result in a phase shift between the magnetometer and accelerometer signals (thereby impacting angle X). Therefore, rather than using a moving average, the cross-axial measurements may be compensated using bias compensation at 212, for example, is given below:

$$\begin{pmatrix} b_{sx} \\ b_{sy} \end{pmatrix} = \frac{1}{N} \sum s_i \begin{pmatrix} s_x \\ s_y \end{pmatrix} = \frac{1}{N} \begin{pmatrix} \Sigma(B_{xi} - B_T(\cos\psi_{Gi}\cos X + \sin\psi_{Gi}\sin X)) \\ \Sigma(B_{yi} - B_T(\cos\psi_{Gi}\sin X - \sin\psi_{Gi}\cos X)) \end{pmatrix} \quad (8)$$

where $b_{sx}$ and $b_{sy}$ represent the cross-axial bias terms and N represents a number of measurements. It will be appreciated that the computed bias $$\begin{pmatrix} b_{sx} \\ b_{sy} \end{pmatrix}$$

is an average of the interference $s_i$ $$\begin{pmatrix} s_x \\ s_y \end{pmatrix}$$

over N measurements. After estimating the bias at 212, the compensated magnetometer measurements may be computed, for example, as follows:

$$\begin{pmatrix} \bar{B}_x^- \\ \bar{B}_y^- \end{pmatrix} = \begin{pmatrix} B_x \\ B_y \end{pmatrix} - \begin{pmatrix} b_{sx} \\ b_{sy} \end{pmatrix} \quad (9)$$

Figure 10:
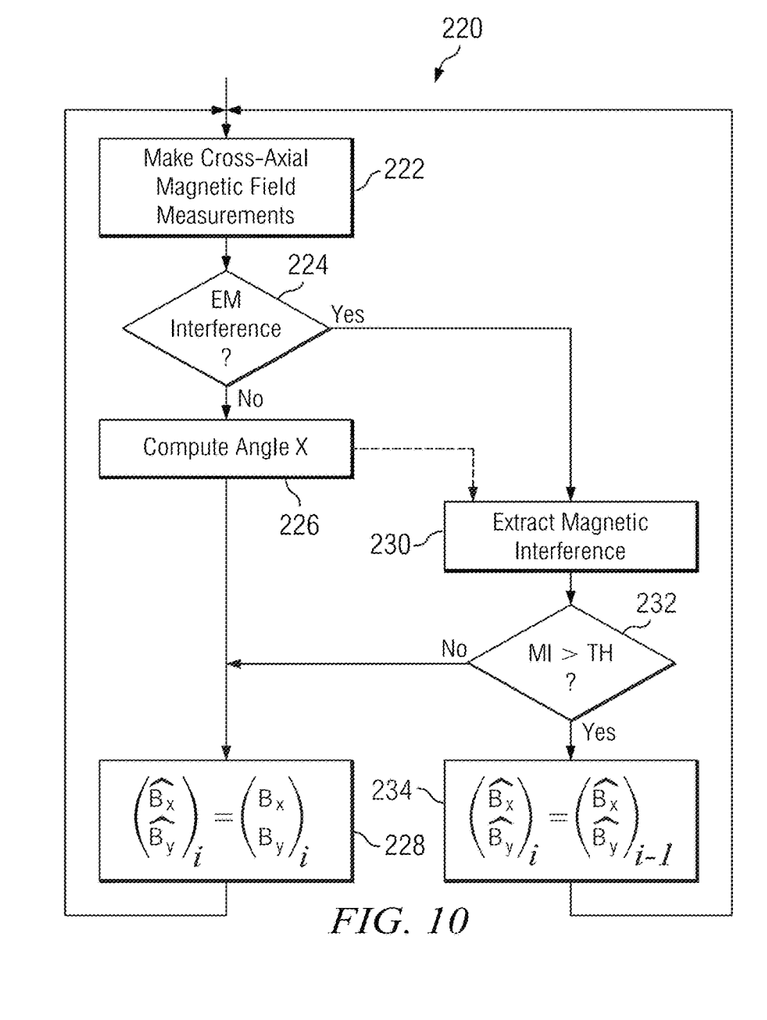
FIG. 10 depicts a flow chart of still another example method for magnetic interference compensation.

FIG. 10 depicts a flow chart of still another example method 220 for magnetic interference compensation in which cross axial magnetic field measurements may be compensated in a manner similar to that described above with respect to FIG. 6. Magnetometer measurements (including cross-axial measurements) may be made, for example, while circulating drilling fluid in the wellbore at 222 (e.g., while drilling). The activity of the EM interference source is monitored at 224. As described above with respect to FIG. 6, the interference source may be active, for example, when the mud pulse or mud siren telemetry system is actively transmitting data to the surface or when an EM transmitter is transmitting electromagnetic energy while making resistivity measurements. Otherwise, the interference source may be taken to be inactive. The RSS controller may be configured to receive tool status updates from the telemetry system or an EM transmitter regarding the activity or inactivity of the source.

With continued reference to FIG. 10, it will be understood that no interference compensation is required when the interference source is inactive (i.e., when there is no EM interference). Therefore, as indicated at 228, $$\begin{pmatrix} \bar{B}_x^- \\ \bar{B}_y^- \end{pmatrix}_i = \begin{pmatrix} B_x \\ B_y \end{pmatrix}_i.$$

In other words, the compensated cross-axial magnetic field measurements $$\begin{pmatrix} \bar{B}_x^- \\ \bar{B}_y^- \end{pmatrix}_i$$

may be taken to be equal to the actual cross-axial magnetic field measurements $$\begin{pmatrix} B_x \\ B_y \end{pmatrix}_i$$

when there is no interference (when the source is inactive). Moreover, angle X may also be computed at 226 when there is no interference. When EM interference is present at 224, the magnetic interference may be extracted at 230, for example, as described above with respect to 208 and 210 of method 200 in FIG. 9. In particular, the magnetic toolface may be estimated using angle X and the gravity tool face allowing the magnetic interference to be extracted as described above. The magnetic interference $s_i$ $$\begin{pmatrix} s_x \\ s_y \end{pmatrix}$$

may then be compared with a predetermined threshold at 232. In example embodiments the threshold may be, for example, one, two, or three standard deviations ($\sigma$, $2\sigma$, or $3\sigma$) of the measurements made without interference. It will be appreciated that the threshold may be selected, for example, to exceed the magnitude of the measurement noise and may be further based on the measurement frequency and how rapidly magnetic field transitions between the maxima and the minima during the intermittent interference.

When the magnetic interference (MI) is greater than the threshold, the compensated cross-axial magnetic field measurement may be set equal to the previous compensated axial magnetic field measurement at 234, e.g., $$\begin{pmatrix} \bar{B}_x^- \\ \bar{B}_y^- \end{pmatrix}_i = \begin{pmatrix} \bar{B}_x^- \\ \bar{B}_y^- \end{pmatrix}_{i-1}.$$

When the magnetic interference (MI) is less than the threshold, the compensated cross-axial magnetic field measurements $$\begin{pmatrix} \bar{B}_x^- \\ \bar{B}_y^- \end{pmatrix}_i$$

may be taken to be equal to the actual cross-axial magnetic field measurements $$\begin{pmatrix} B_x \\ B_y \end{pmatrix}_i$$

at 228.

As described above, the compensated magnetometer measurements (e.g., using compensated axial measurements and non-compensated cross-axial measurements, compensated cross-axial measurements and non-compensated axial measurements, or compensated axial measurements and compensated cross-axial measurements) may be used to compute the wellbore azimuth (e.g., continuously while drilling). It will be appreciated that the computed wellbore azimuth may be used to control and/or change the direction of drilling (e.g., in automated drilling routines that are configured to control the direction of drilling along a predetermined drill plan). In some embodiments, the computed wellbore azimuth may be compared with a desired azimuth. The drilling direction may be changed, for example, in order to meet the drill plan, or when the difference between the computed and desired direction (inclination and azimuth) or curvature exceeds a predetermined threshold. Such a change in drilling direction may be implemented, for example, via actuating steering elements (e.g., as shown in FIG. 2) in a rotary steerable tool.

In a first embodiment, a method for making compensated magnetic field measurements in a wellbore comprises deploying a downhole tool in the wellbore; the downhole tool including a magnetic field sensor in sensory range of an intermittent source of electromagnetic (EM) interference; using the magnetic field sensor to make magnetic field measurements while the downhole tool is deployed in the wellbore; computing a first average of the magnetic field measurements over a first time interval in which there is no EM interference; computing a second average of the magnetic field measurements over a second time interval in which there is EM interference; computing an interference offset as a difference between the first average and the second average; and removing the interference offset from magnetic field measurements made at a subsequent time during which there is EM interference to compute compensated magnetic field measurements.

A second embodiment may include the first embodiment, further comprising circulating drilling fluid through the downhole tool; and actuating a solenoid valve in a rotary pulser to generate the intermittent EM interference.

A third embodiment may include any one of the first through second embodiments, wherein the downhole tool is a rotary steerable tool and the method further comprises computing a wellbore azimuth using the compensated magnetic field measurements; and changing a direction of the drilling in response to the computed wellbore azimuth.

A fourth embodiment may include any one of the first through third embodiments, wherein the magnetic field sensor is an axial magnetic field sensor and the magnetic field measurements comprise axial magnetic field measurements.

A fifth embodiment may include any one of the first through fourth embodiments, wherein the removing the interference offset comprises computing a moving average of a sum of the magnetic field measurements and the offset.

A sixth embodiment may include any one of the first through fifth embodiments, wherein the first and second time intervals are non-overlapping and are separated in time by a transition buffer that has a duration that is shorter than a duration of either of the first time interval and the second time interval.

A seventh embodiment may include any one of the first through sixth embodiments, further comprising repeating the computing a first average, the computing a second average, and the computing the interference offset during a drilling operation to obtain an updated interference offset; and removing the updated interference offset from magnetic field measurements made during later time periods during which there is EM interference to compute the compensated magnetic field measurements.

In an eighth embodiment a downhole tool comprises a magnetic field sensor deployed in a downhole tool body in sensory range of magnetic flux emanating from an intermittent source of electromagnetic interference; and a processor configured to: cause the magnetic field sensor to make magnetic field measurements while the downhole tool is deployed in a wellbore; compute a first average of the magnetic field measurements over a first time interval in which there is no EM interference; compute a second average of the magnetic field measurements over a second time interval in which there is EM interference; compute an interference offset as a difference between the first average and the second average; and remove the interference offset from magnetic field measurements made during a subsequent period during which there is EM interference to compute compensated magnetic field measurements.

A ninth embodiment may include the eighth embodiment, wherein the downhole tool is a rotary steerable tool and the processor is further configured to compute a wellbore azimuth using the compensated magnetic field measurements; and change a direction of the drilling in response to the computed wellbore azimuth.

A tenth embodiment may include the ninth embodiment, further comprising a rotary steerable tool body configured to support a plurality of steering actuators, the steering actuators configured to change the direction of drilling.

An eleventh embodiment may include any one of the eighth through tenth embodiments, wherein the magnetic field sensor is an axial magnetic field sensor and the magnetic field measurements comprise axial magnetic field measurements.

A twelfth embodiment may include any one of the eighth through eleventh embodiments, further comprising a mud pulser, wherein a solenoid actuated valve in the mud pulser is the intermittent source of EM interference.

A thirteenth embodiment may include any one of the eighth through twelfth embodiments, wherein the processor is configured to remove the interference offset by computing a moving average of a sum of the magnetic field measurements and the offset.

A fourteenth embodiment may include any one of the eighth through thirteenth embodiments, wherein the processor is configured to include a transition buffer between the first and second time intervals such that the first and second time intervals are non-overlapping, the transition buffer having a duration that is shorter than a duration of either of the first time interval or the second time interval.

In a fifteenth embodiment a method for making compensated magnetic field measurements in a wellbore comprises deploying a downhole tool in the wellbore, the downhole tool including a magnetic field sensor in sensory range of an intermittent source of electromagnetic interference; using the magnetic field sensor to make magnetic field measurement while the downhole tool is deployed in the wellbore; monitoring the intermittent source of electromagnetic interference; setting a compensated magnetic field measurement equal to the magnetic field measurement when the intermittent source of electromagnetic interference is inactive; computing a difference between the magnetic field measurement and a previous compensated magnetic field measurement when the source of the electromagnetic interference is active; comparing the difference with a predetermined threshold; setting the compensated magnetic field measurement equal to the magnetic field measurement when the difference is less than the threshold; and setting the compensated magnetic field measurement equal to the previous compensated magnetic field measurement when the difference is greater than the threshold.

A sixteenth embodiment may include the fifteenth embodiment, further comprising circulating drilling fluid through the downhole tool; and actuating a solenoid valve in a rotary pulser to generate the intermittent EM interference.

A seventeenth embodiments may include any one of the fifteenth through sixteenth embodiments, wherein the downhole tool is a rotary steerable tool and the method further comprises computing a wellbore azimuth using the compensated magnetic field measurements; and changing a direction of the drilling in response to the computed wellbore azimuth.

An eighteenth embodiment may include any one of the fifteenth through seventeenth embodiments, wherein the magnetic field sensor is an axial magnetic field sensor and the magnetic field measurements comprise axial magnetic field measurements.

A nineteenth embodiment may include any one of the fifteenth through eighteenth embodiments, wherein the predetermined threshold is selected to be greater than a measurement noise of the magnetic field measurements.

A twentieth embodiments may include any one of the fifteenth through nineteenth embodiments, wherein the difference comprises a difference between the magnetic field measurement and a moving average of a plurality of previous compensated magnetic field measurements.

Although interference compensated magnetometer measurements and certain advantages thereof have been described in detail, it should be understood that various changes, substitutions and alterations may be made herein without departing from the spirit and scope of the disclosure.

The invention claimed is:

1. A downhole tool comprising:
   a magnetic field sensor deployed in a downhole tool body in sensory range of magnetic flux emanating from an intermittent source of electromagnetic interference;
   a processor configured to:
      cause the magnetic field sensor to make magnetic field measurements while the downhole tool is deployed in a wellbore;
      compute a first average of the magnetic field measurements over a first time interval in which there is no EM interference;
      compute a second average of the magnetic field measurements over a second time interval in which there is EM interference;
      compute an interference offset as a difference between the first average and the second average; and
      remove the interference offset from magnetic field measurements made during a subsequent period during which there is EM interference to compute compensated magnetic field measurements by computing a moving average of a sum of the magnetic field measurements and the offset.

2. The downhole tool of claim 1, wherein the downhole tool is a rotary steerable tool and the processor is further configured to:
   compute a wellbore azimuth using the compensated magnetic field measurements; and
   change a direction of the drilling in response to the computed wellbore azimuth.

3. The downhole tool of claim 2, further comprising a rotary steerable tool body configured to support a plurality of steering actuators, the steering actuators configured to change the direction of drilling.

4. The downhole tool of claim 1, wherein the magnetic field sensor is an axial magnetic field sensor and the magnetic field measurements comprise axial magnetic field measurements.

5. The downhole tool of claim 1, further comprising a mud pulser, wherein a solenoid actuated valve in the mud pulser is the intermittent source of EM interference.

6. The downhole tool of claim 1, wherein the processor is configured to include a transition buffer between the first and second time intervals such that the first and second time intervals are non-overlapping, the transition buffer having a duration that is shorter than a duration of either of the first time interval or the second time interval.

* * * * *